(12) United States Patent
Dutta et al.

(10) Patent No.: US 11,081,643 B1
(45) Date of Patent: Aug. 3, 2021

(54) BEVEL METAL REMOVAL USING ION BEAM ETCH

(71) Applicant: International Business Machines Corporation, Armonk, NY (US)

(72) Inventors: Ashim Dutta, Menands, NY (US); Saba Zare, Albany, NY (US); Michael Rizzolo, Delmar, NY (US); Theodorus E. Standaert, Clifton Park, NY (US); Daniel C. Edelstein, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/748,738

(22) Filed: Jan. 21, 2020

(51) Int. Cl.
*H01L 43/12* (2006.01)
*H01L 27/22* (2006.01)

(52) U.S. Cl.
CPC ........... *H01L 43/12* (2013.01); *H01L 27/222* (2013.01)

(58) Field of Classification Search
None
See application file for complete search history.

(56) References Cited

U.S. PATENT DOCUMENTS

| | | | |
|---|---|---|---|
| 6,309,981 B1 | 10/2001 | Mayer et al. | |
| 6,586,342 B1 | 7/2003 | Mayer et al. | |
| 6,833,063 B2 | 12/2004 | Basol | |
| 9,685,353 B2 | 6/2017 | Ganesan et al. | |
| 9,859,329 B2* | 1/2018 | Hirota | H01L 27/14692 |
| 2007/0068900 A1 | 3/2007 | Kim et al. | |
| 2010/0055924 A1 | 3/2010 | Ganesan et al. | |
| 2015/0194595 A1* | 7/2015 | Park | H01L 43/08 257/421 |
| 2016/0059354 A1 | 3/2016 | Sercel et al. | |
| 2016/0064215 A1 | 3/2016 | Sexton et al. | |
| 2016/0064232 A1 | 3/2016 | Berry, III et al. | |
| 2018/0076035 A1* | 3/2018 | Bergendahl | H01L 21/0337 |
| 2018/0233662 A1 | 8/2018 | Berry, III et al. | |

OTHER PUBLICATIONS

Xu et al., Recent Developments in Focused Ion Beam and Its Application in Nanotechnology, Current Nanoscience, vol. 12, No. 6, 2016, pp. 696-711(16).

* cited by examiner

*Primary Examiner* — Mounir S Amer
(74) *Attorney, Agent, or Firm* — Daniel Morris; Otterstedt, Wallace & Kammer, LLP

(57) ABSTRACT

Form a metallized layer at a top surface of a semiconductor wafer. The metallized layer includes a bottom contact and a dielectric barrier surrounding the bottom contact. Deposit a memory stack layer onto the metallized layer. The memory stack layer forms a first overspill on a bevel of the wafer. Remove the first overspill from the bevel using a first high-angle ion beam during a cleanup etch.

20 Claims, 15 Drawing Sheets

BEVEL METAL REMOVAL USING ION BEAM ETCH

BACKGROUND

The present invention relates to the electrical, electronic, and computer arts, and more specifically, to semiconductor device fabrication.

During conventional production of a semiconductor wafer, successive layers of dielectric, metal, encapsulant, etc. are built up on a top surface of the wafer, i.e. a back-end-of-line surface. Each layer tends to wrap around or overspill onto the edge or bevel of the wafer, i.e. the surface that connects the bottom surface of the wafer to a top surface of the wafer. In technical drawings the bevel often is shown as perpendicular to the bottom and top surfaces; however, that is not the case. Instead, the bevel surface typically is bulged outward in a convex fashion. The overspill of built up layers exacerbates the bulging shape to an unpredictable extent.

During handling of a conventionally produced wafer, the fragile overspill layers sometimes flake from the bevel, which causes process impurities that lead to wafer defects.

SUMMARY

Principles of the invention provide techniques for enhancing bevel metal removal using ion beam etch. In one aspect, an exemplary method includes forming a metallized layer at a top surface of a semiconductor wafer and depositing a memory stack layer onto the metallized layer. The metallized layer includes a bottom contact and a dielectric barrier surrounding the bottom contact. The memory stack layer forms a first overspill on a bevel of the wafer. The exemplary method further includes removing the first overspill from the bevel using a first high-angle ion beam during a cleanup etch.

In another aspect, an exemplary method includes forming a metallized layer at a top surface of a semiconductor wafer, depositing a memory stack layer onto the metallized layer, and depositing a metal hardmask onto the memory stack layer. The memory stack layer forms a first overspill on a bevel of the wafer and the hardmask forms a second overspill on the bevel. The method also includes removing the second overspill from the bevel using a first high-angle ion beam during trimming of the hardmask.

According to another aspect, an exemplary method includes forming a metallized layer at a top surface of a semiconductor wafer, depositing a memory stack layer onto the metallized layer, and depositing a metal hardmask onto the memory stack layer. The memory stack layer forms a first overspill on a bevel of the wafer and the hardmask forms a second overspill on the bevel. The method also includes removing the second overspill from the bevel using a first high-angle ion beam during trimming of the hardmask.

In view of the foregoing, techniques of the present invention can provide substantial beneficial technical effects. For example, one or more embodiments provide one or more of:

High precision and repeatable fabrication of semiconductor wafers free from overspill layers on the wafer bevels.

Removal of overspill layers from wafer bevels without forming pits or silicon needles.

Removal of materials from the bevel does not require any aggressive chemical dry or wet bevel etch and any bevel specific etch chamber. Also, the proposed process is very non-selective and can be used for removing wide variety of materials (metal, dielectric etc.) from the bevel simultaneously.

These and other features and advantages of the present invention will become apparent from the following detailed description of illustrative embodiments thereof, which is to be read in connection with the accompanying drawings.

DETAILED DESCRIPTION

In order to reduce wafer defects, it is desirable to provide a semiconductor wafer that does not have overspill layers on its bevel. While some efforts have been made to accomplish this using wet or dry chemical etches, such etches tend to be overselective so that they can cause pitting and formation of silicon needles on the bevel. Accordingly, it is desirable to remove overspill layers in a way that does not produce pits or silicon needles.

Several embodiments of the invention provide for removing overspill layers without producing pits or silicon needles.

Figure 1:
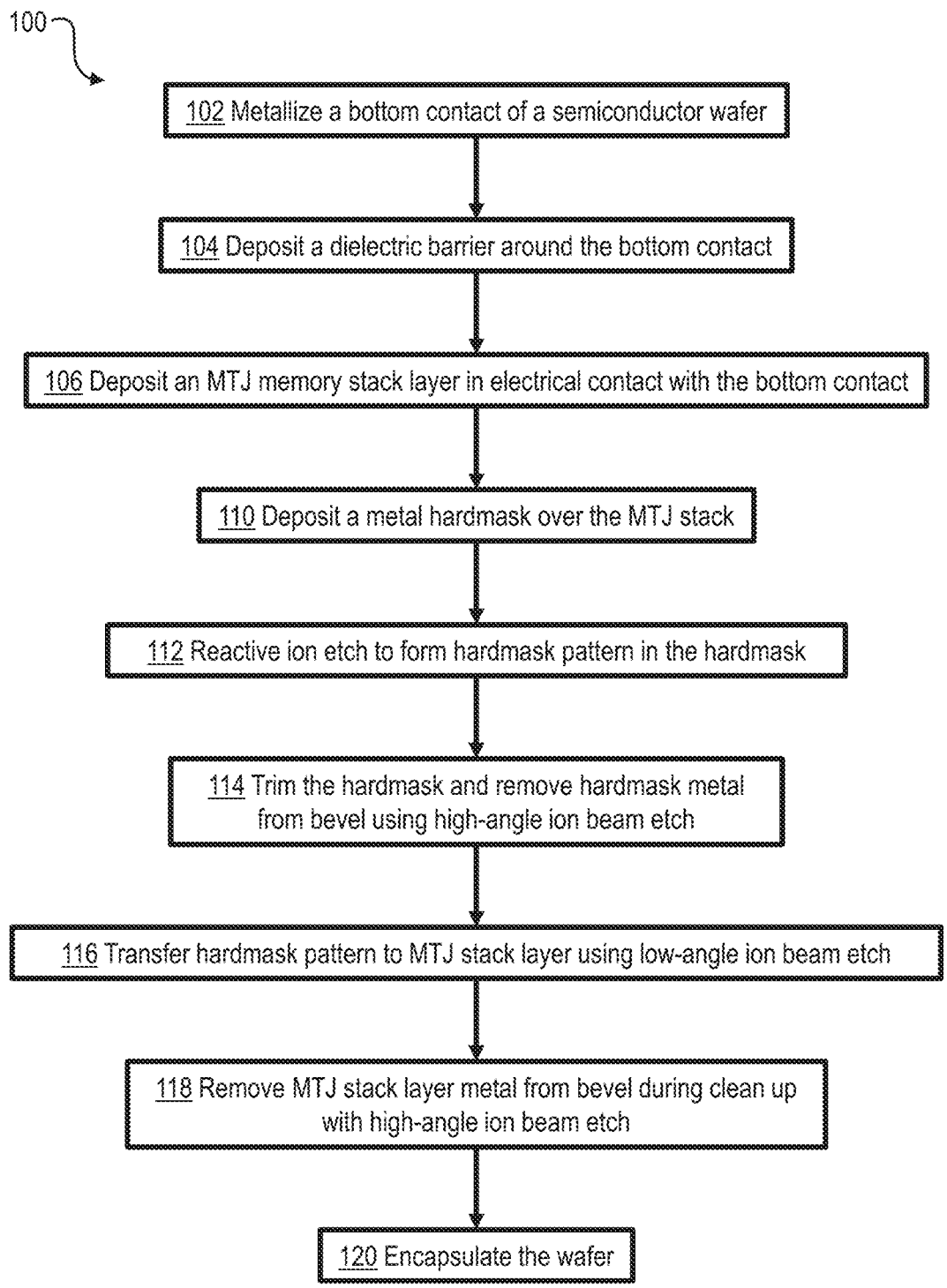
FIG. 1 depicts in a flowchart steps of a method for producing a semiconductor wafer free of metal on its bevel, according to an exemplary embodiment.
Figure 2A:
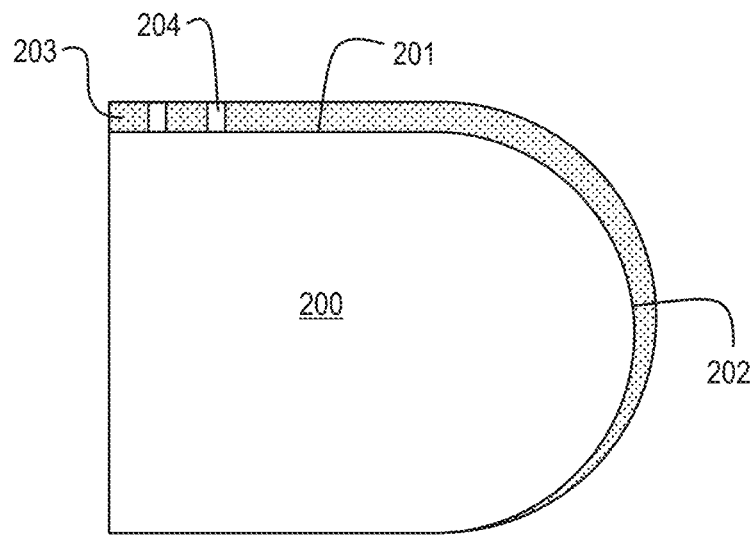
FIGS. 2A, 2B, 2C, 2D, 2E, 2F and 2G depict in side section views conditions of the semiconductor wafer according to various steps of the method shown in FIG. 1.
Figure 2B:
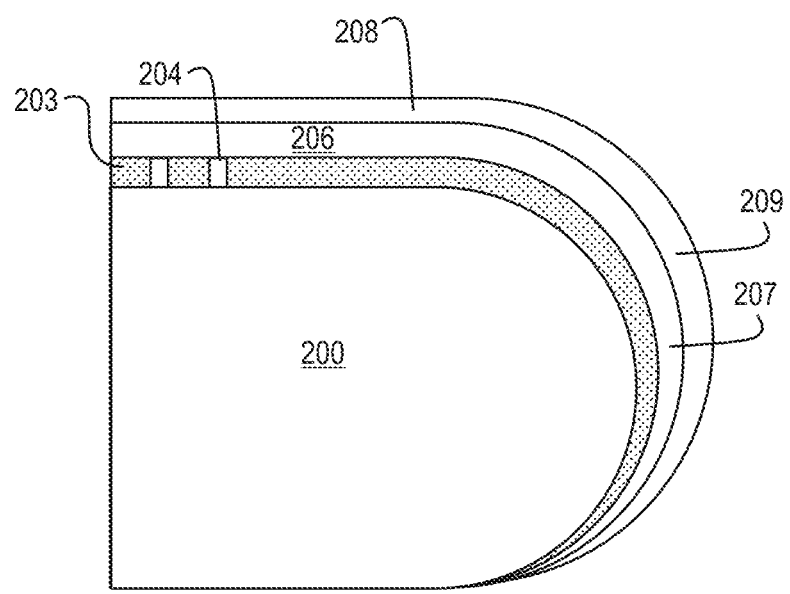
Figure 2C:
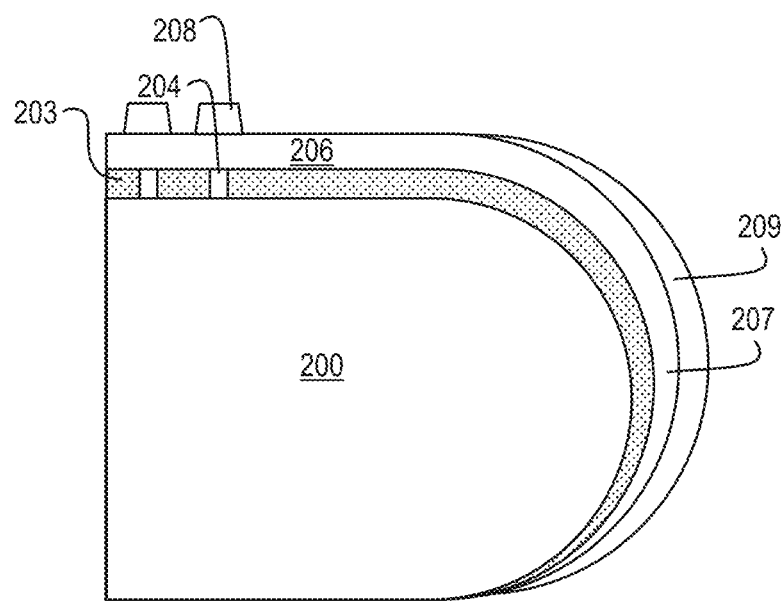
Figure 2D:
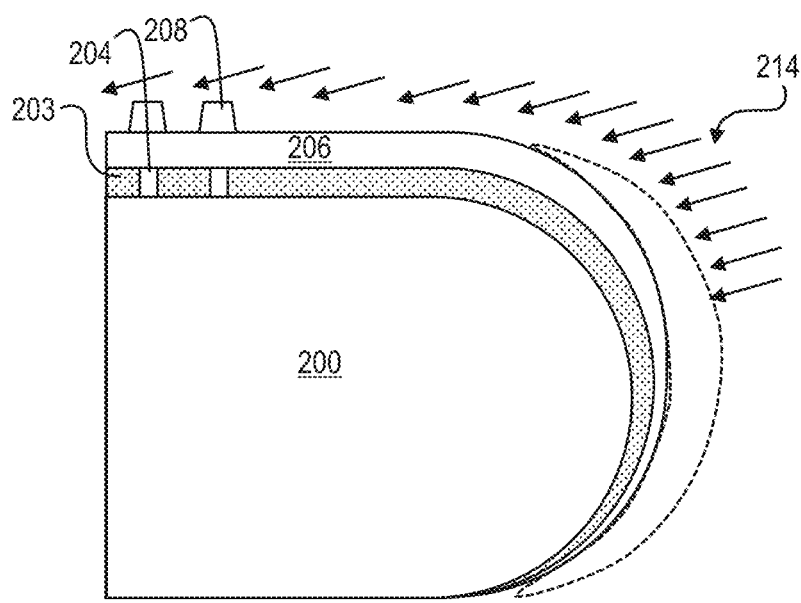
Figure 2E:
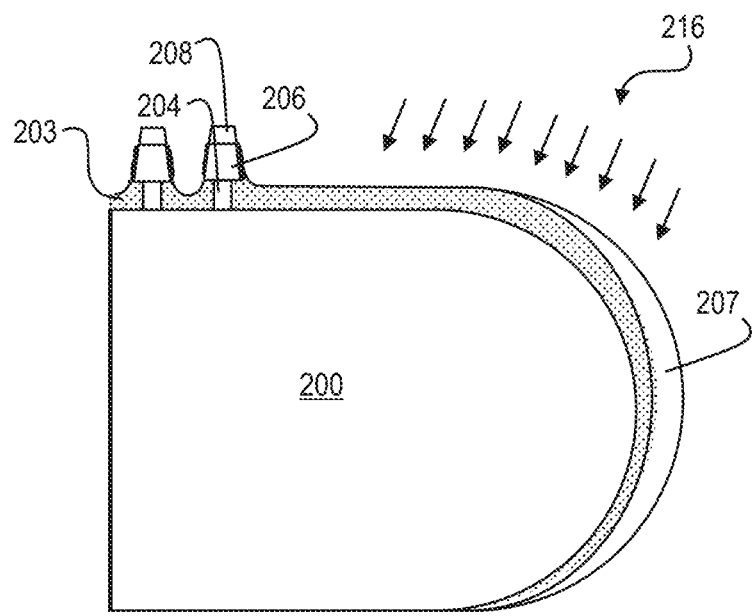
Figure 2F:
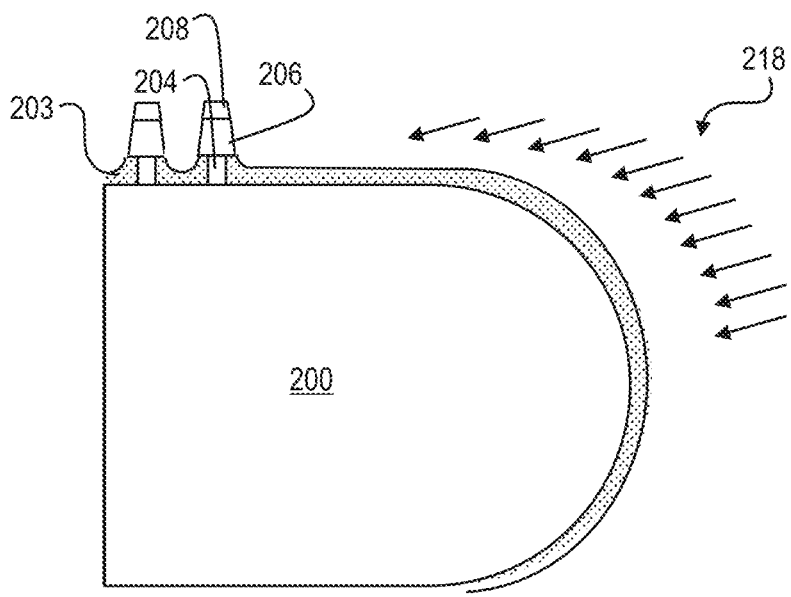
Figure 2G:
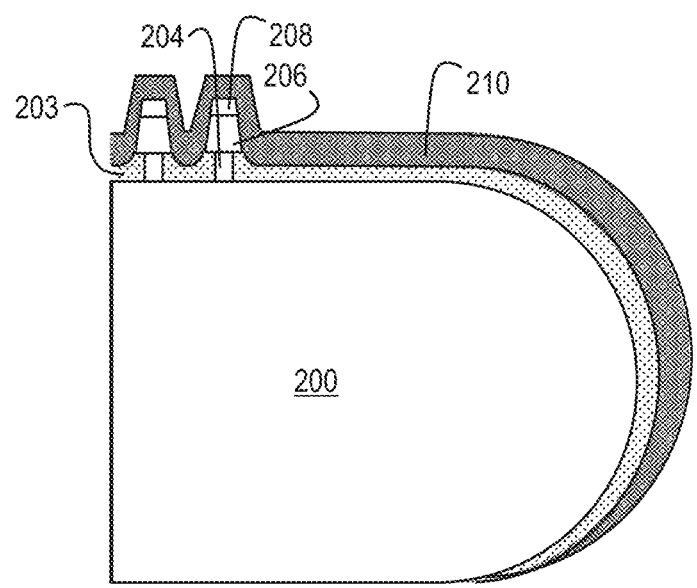

FIG. 1 depicts a method 100 according to one exemplary embodiment. As will be further discussed, the method 100 makes use of ion beam etching for purposes other than pattern transfer, in a manner not currently familiar to the ordinary skilled worker but possible to accomplish with existing tooling. At 102, metallize a bottom contact of a semiconductor wafer preparatory to forming a memory stack on the wafer. At 104, deposit a dielectric barrier around the bottom contact. At 106, deposit a memory stack layer (e.g., magnetic tunnel junction (MTJ) metal) on the dielectric in electrical contact with the bottom contact. Memory stack metals, such as those used for MTJ memory (MRAM), generally are deposited in complex combinations that are not amenable to single-step chemical etching. At 110, deposit a metal hardmask over the memory stack layer. At 112, reactive ion etch the hardmask to form a hardmask pattern. Note that at least during the etching steps of all methods discussed herein, the wafer or workpiece is rotating about an axis perpendicular to its top surface. At 114, trim the hardmask and remove the hardmask metal from the wafer bevel using a high-angle ion beam etch. This step simultaneously cleans up the wafer bevel and reduces the critical dimension of the hardmask so that the memory stack pillar will be the appropriate size. At 116, transfer the hardmask pattern to the memory stack layer using a low-to-intermediate angle ion beam etch. At 118, remove the memory stack layer metal from the wafer bevel during memory pillar sidewall cleanup with a high-angle ion beam etch. At 120, encapsulate the wafer.

FIGS. 2A-2G depict schematically sequential conditions of a semiconductor wafer 200 at various steps during the process 100. At FIG. 2A, corresponding to the condition after step 104, the wafer 200 has a top surface 201 and has a bevel 202. On the top surface 201 there is a dielectric layer 203, which includes metallized bottom contacts 204. At FIG. 2B, corresponding to the condition after step 110, an MTJ memory stack layer 206 is deposited in electrical contact with the bottom contacts and a metal hardmask 208 is deposited onto the memory stack layer. The memory stack layer 206 has overspill 207 onto the bevel 202, and the hardmask 208 has overspill 209. At FIG. 2C, corresponding to the condition after step 112, a reactive ion etch process forms a hardmask pattern in the hardmask 208. At FIG. 2D, corresponding to step 114, a high-angle ion beam 214 trims the hardmask 208 and removes the hardmask overspill 209 from the wafer bevel. It may also remove material 207 partially. In this context, a "high-angle" ion beam is one that is delivered onto the wafer at an angle greater than 60° but less than 90° from perpendicular to the top surface. At FIG. 2E, corresponding to step 116, the hardmask pattern is transferred to the memory stack layer 206 by a low-to-intermediate-angle ion beam 216. In this context, a "low-angle" ion beam is delivered onto the wafer at an angle less than or equal to 30° from perpendicular to the top surface; an "intermediate-angle" ion beam is delivered at an angle greater than 30° but less than or equal to 60° from perpendicular to the top surface. At FIG. 2F, corresponding to step 118, a high-angle ion beam 218 cleans up the hardmask and the memory stack layer, removing the memory stack layer overspill 207 from the wafer bevel. At FIG. 2G, corresponding to the condition after step 120, the wafer 200 is encapsulated with an encapsulant 210.

Figure 3:
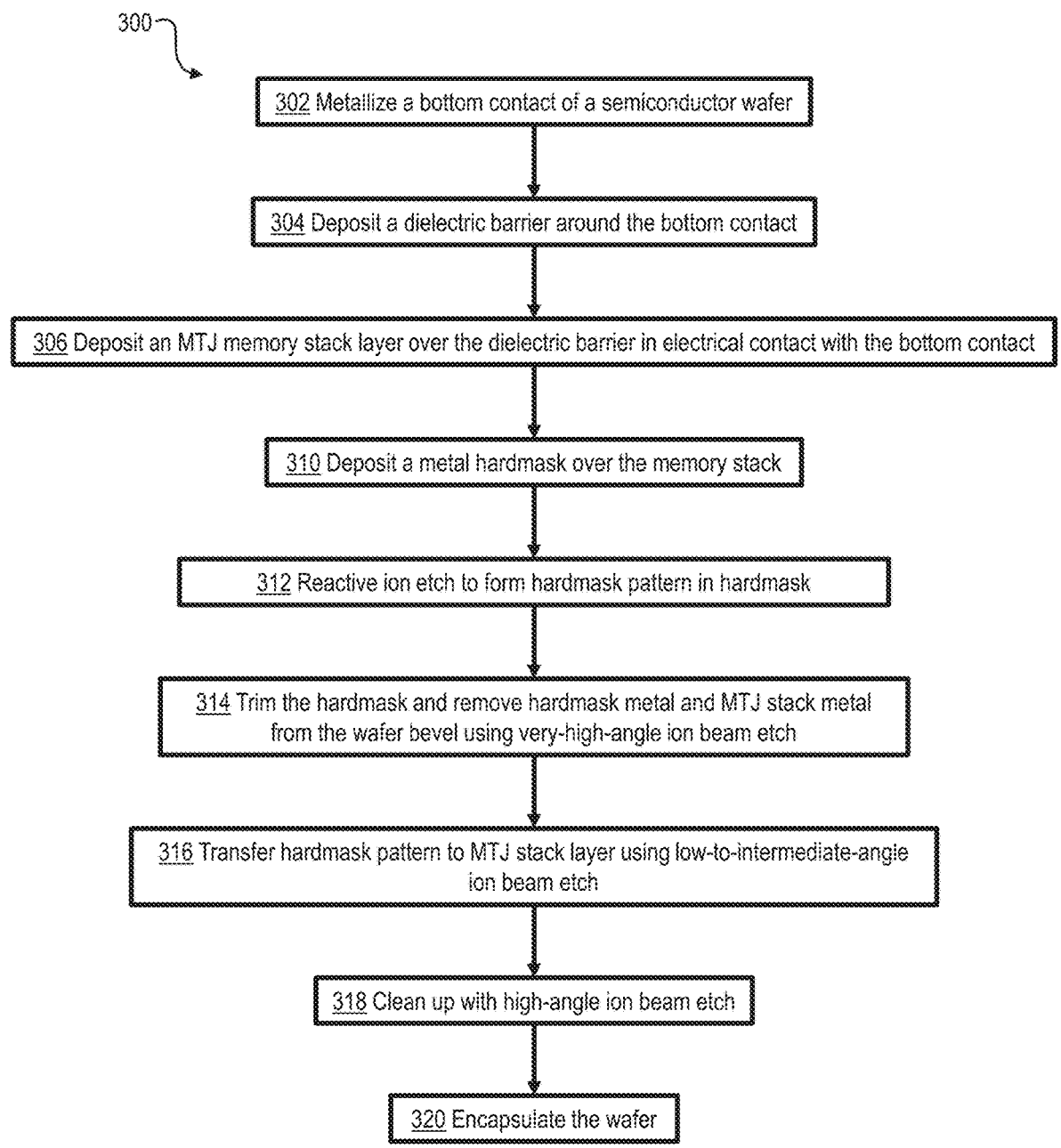
FIG. 3 depicts in a flowchart steps of a method for producing a semiconductor wafer free of metal on its bevel, according to an exemplary embodiment.
Figure 4A:
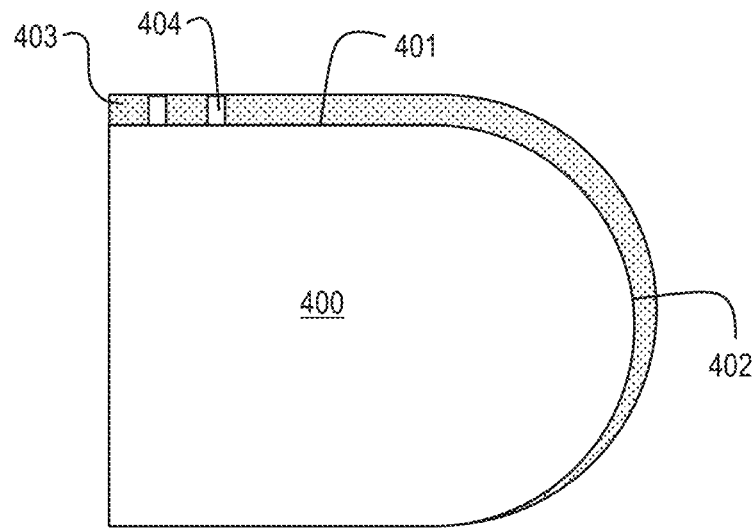
FIGS. 4A, 4B, 4C, 4D, 4E, 4F, and 4G depict in side section views conditions of the semiconductor wafer according to various steps of the method shown in FIG. 3.
Figure 4B:
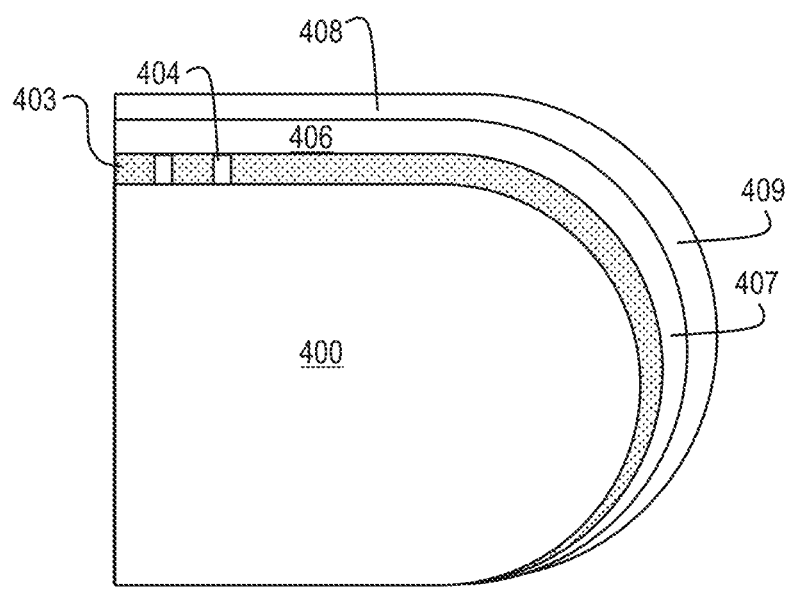
Figure 4C:
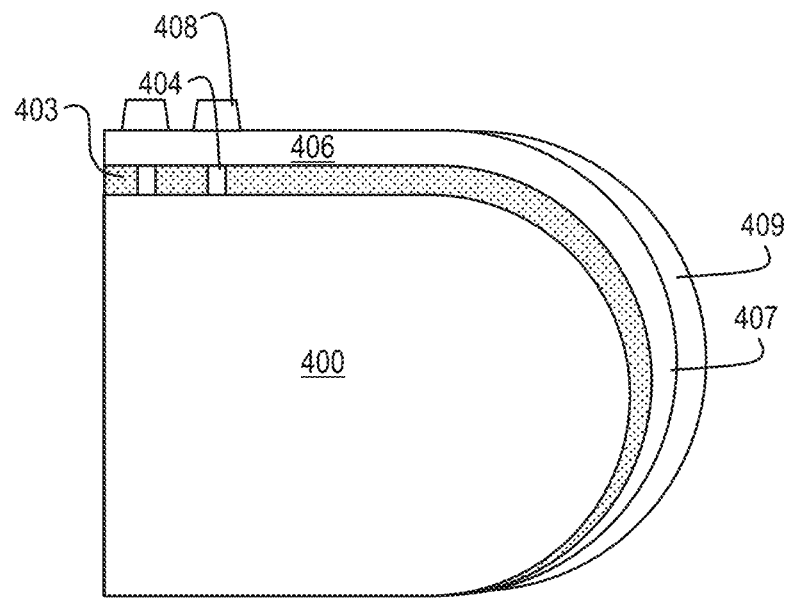
Figure 4D:
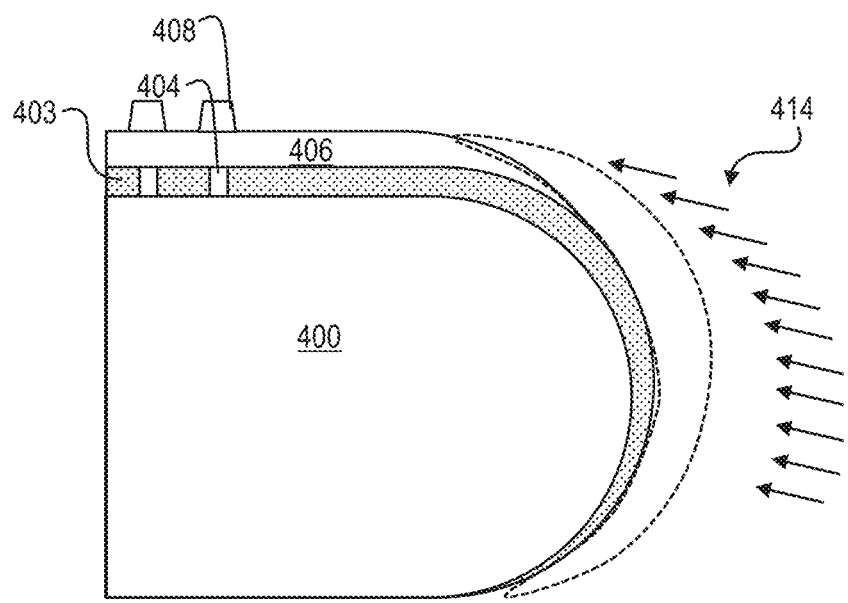
Figure 4E:
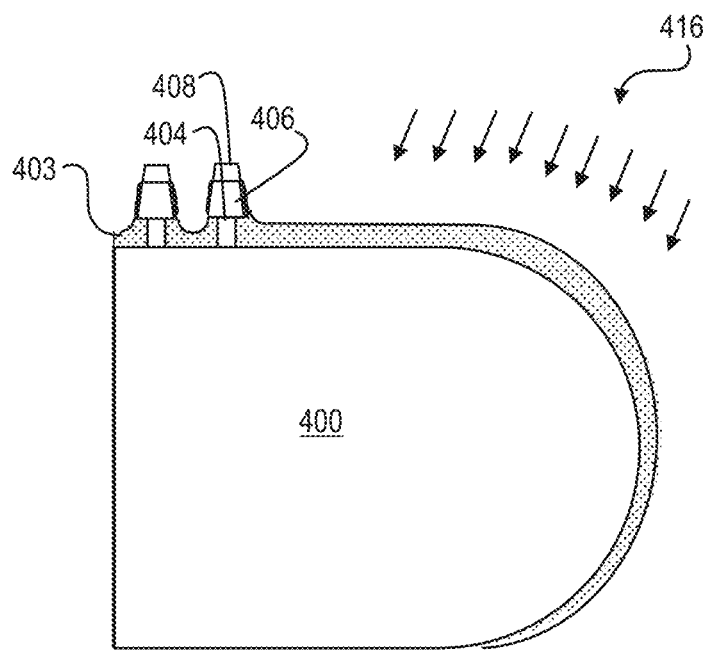
Figure 4F:
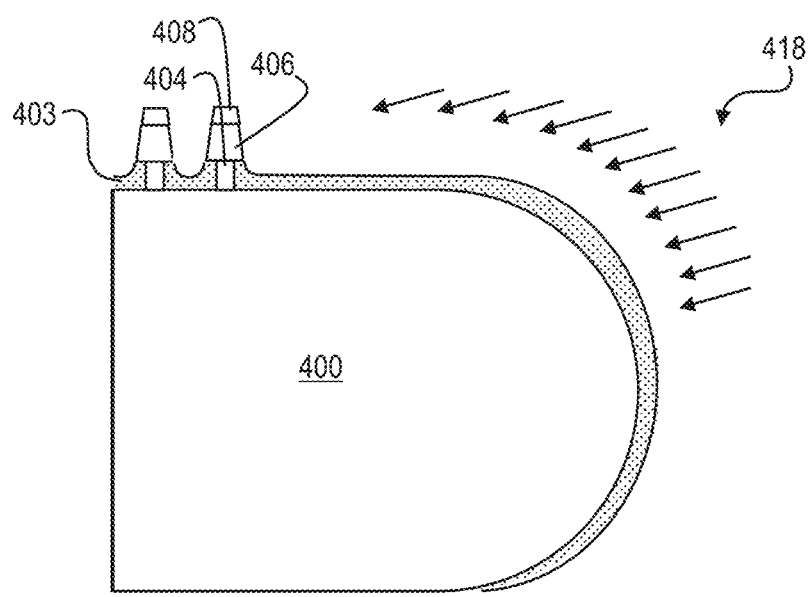
Figure 4G:
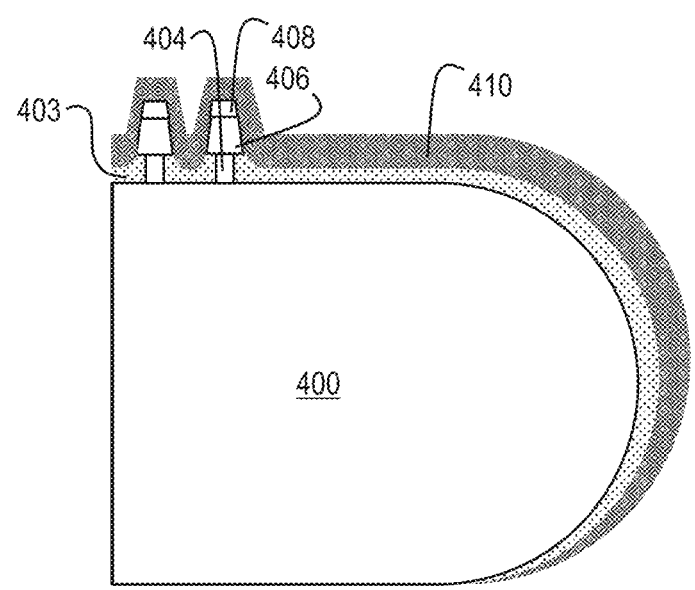

FIG. 3 depicts in a flowchart a method 300 according to an exemplary embodiment. At 302, metallize a bottom contact of a semiconductor wafer preparatory to forming a memory stack on the wafer. At 304, deposit a dielectric barrier around the bottom contact. At 306, deposit a memory stack layer (e.g., magnetic tunnel junction (MTJ) metal) on the dielectric in electrical contact with the bottom contact. At 310, deposit a metal hardmask over the memory stack layer. At 312, reactive ion etch the hardmask to form a hardmask pattern. At 314, trim the hardmask and remove the hardmask metal and the memory stack metal from the wafer bevel using a very-high-angle ion beam etch. In this context, a "very-high-angle" ion beam is delivered at an angle greater than or equal to 90° from perpendicular to the top surface. At 316, transfer the hardmask pattern to the memory stack layer using a low-to-intermediate angle ion beam etch. At 318, cleanup with a high-angle ion beam etch. At 320, encapsulate the wafer.

FIGS. 4A-4G depict schematically sequential conditions of a semiconductor wafer 400 at various steps during the process 300. At FIG. 4A, corresponding to the condition after step 304, the wafer 400 has a top surface 401 and has a bevel 402. On the top surface 401 there is a dielectric layer 403, which includes metallized bottom contacts 404. At FIG. 4B, corresponding to the condition after step 310, an MTJ memory stack layer 406 is deposited in electrical contact with the bottom contacts and a metal hardmask 408 is deposited onto the memory stack layer. The memory stack layer 406 has overspill 407 onto the bevel 402, and the hardmask 408 has overspill 409. At FIG. 4C, corresponding to the condition after step 312, a reactive ion etch process forms a hardmask pattern in the hardmask 408. At FIG. 4D, corresponding to step 314, the hardmask 408 and the memory stack layer 406 are trimmed by a very-high-angle ion beam 414, which removes the hardmask overspill 409 and the memory stack overspill 407 from the wafer bevel. At FIG. 4E, corresponding to step 316, the hardmask pattern is transferred to the memory stack layer 406 by a low-to-intermediate-angle ion beam 416. At FIG. 4F, corresponding to step 318, a high-angle ion beam 418 cleans up redeposition on the memory pillar sidewalls. At FIG. 4G, corresponding to the condition after step 320, the wafer 400 is encapsulated with an encapsulant 410.

Figure 5:
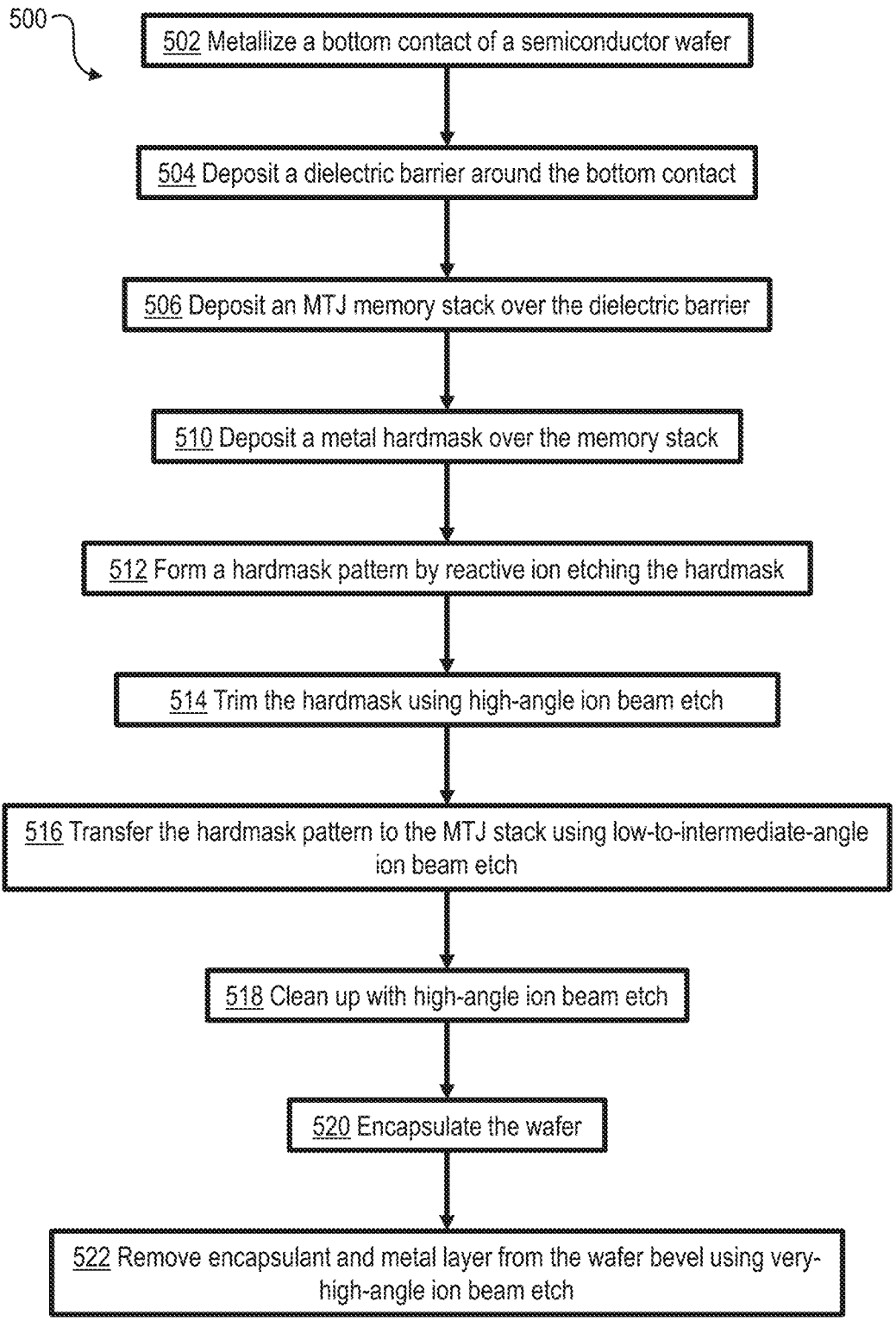
FIG. 5 depicts in a flowchart steps of a method for producing a semiconductor wafer free of metal on its bevel, according to an exemplary embodiment.
Figure 6A:
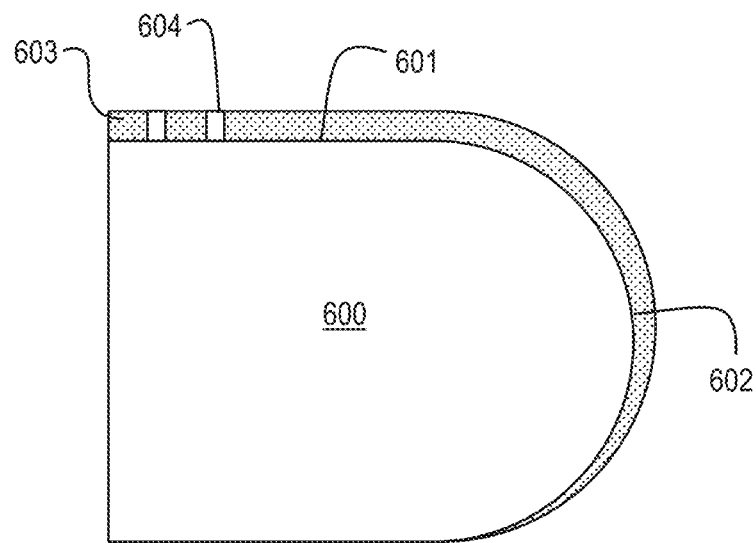
FIGS. 6A, 6B, 6C, 6D, 6E, 6F, 6G and 6H depict in side section views conditions of the semiconductor wafer according to various steps of the method shown in FIG. 5.
Figure 6B:
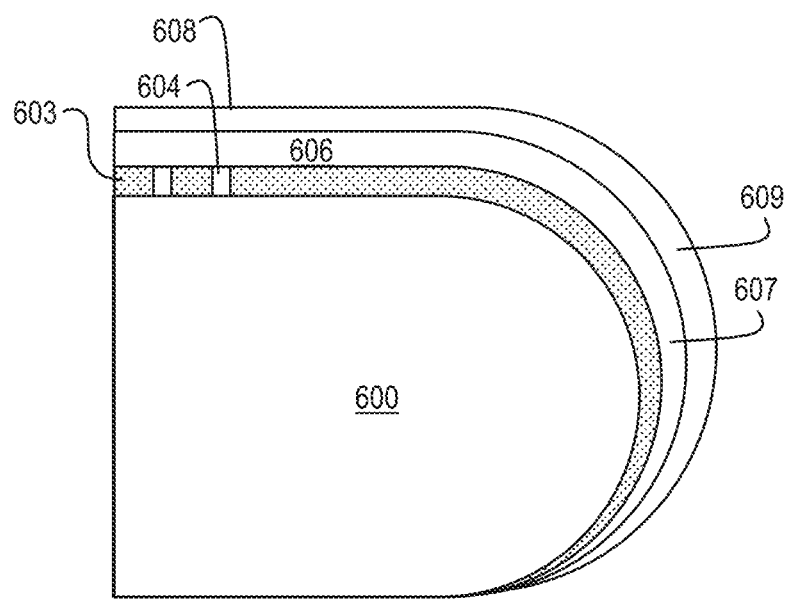
Figure 6C:
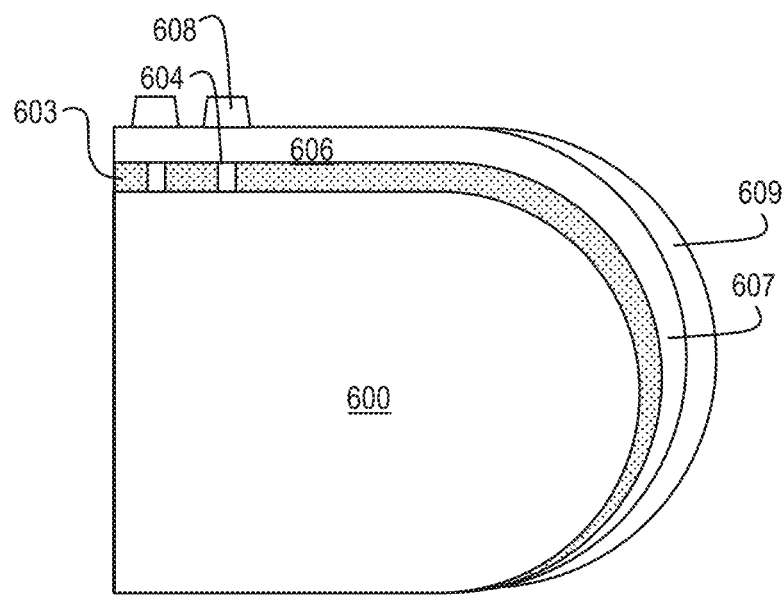
Figure 6D:
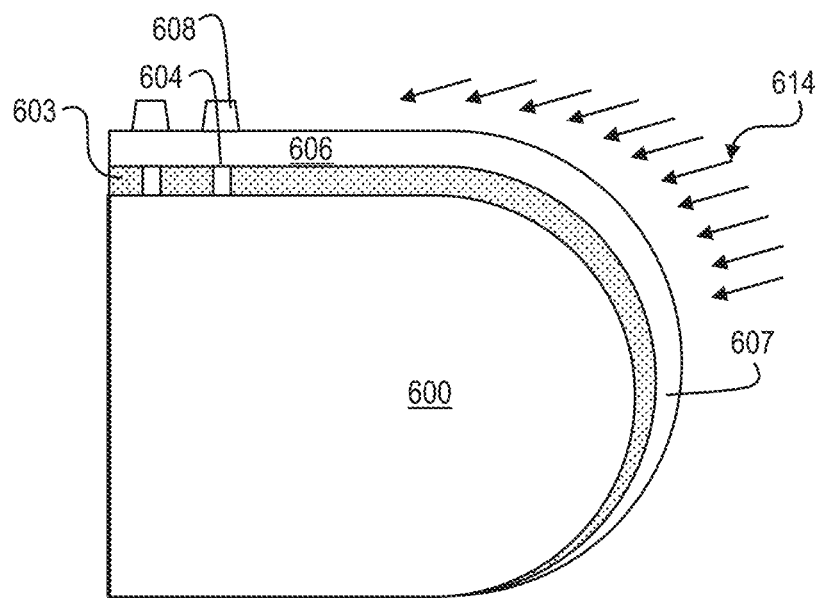
Figure 6E:
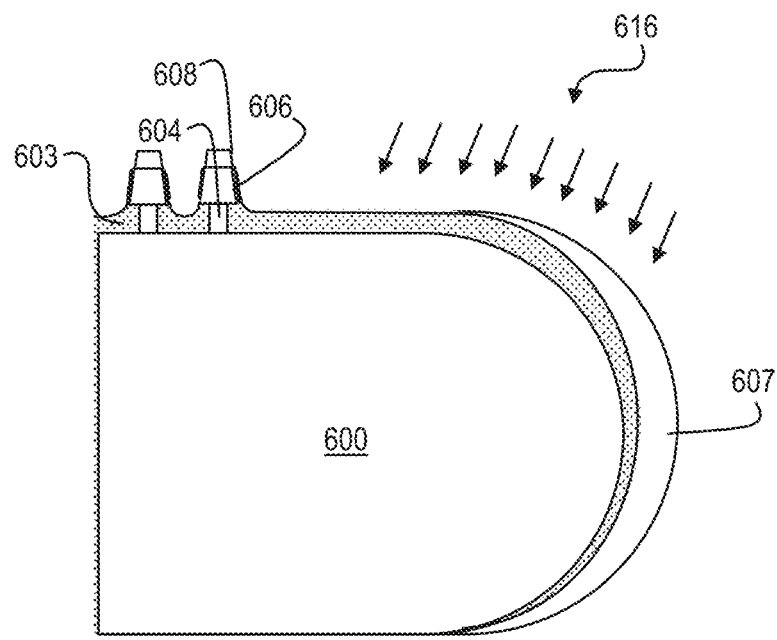
Figure 6F:
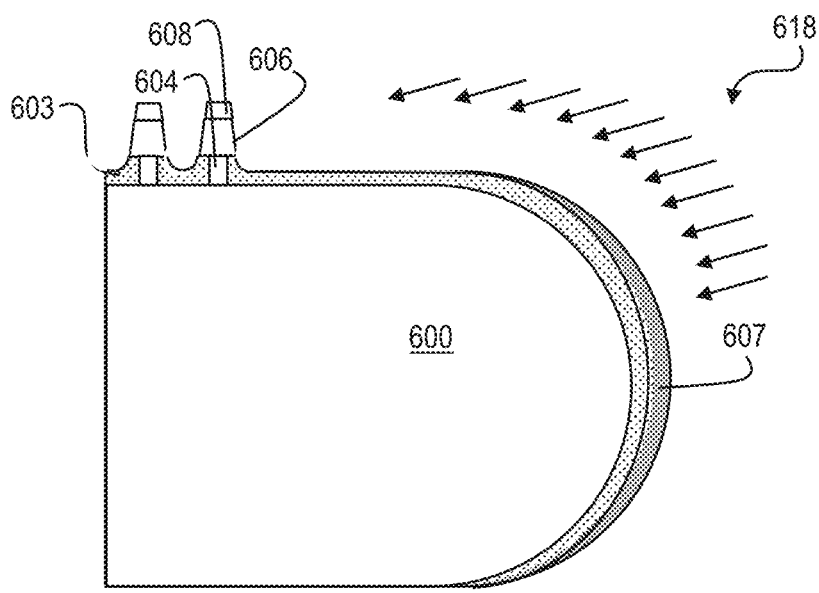
Figure 6G:
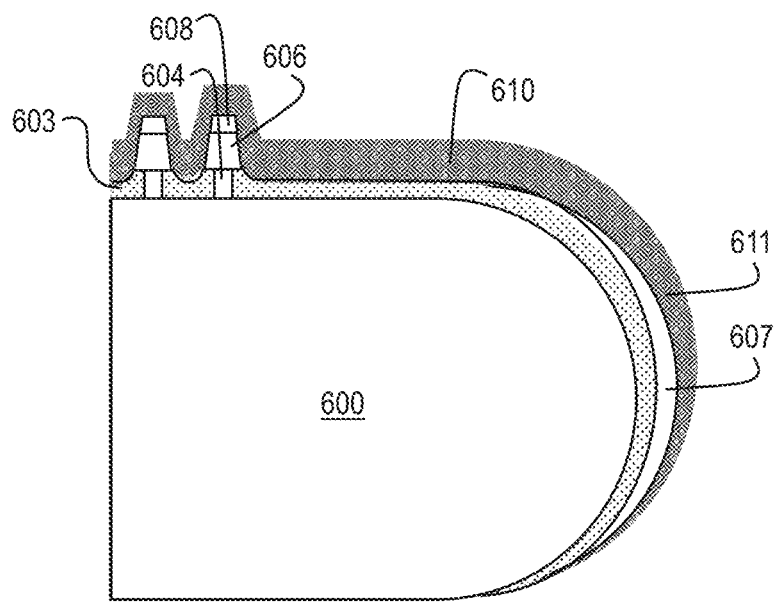
Figure 6H:
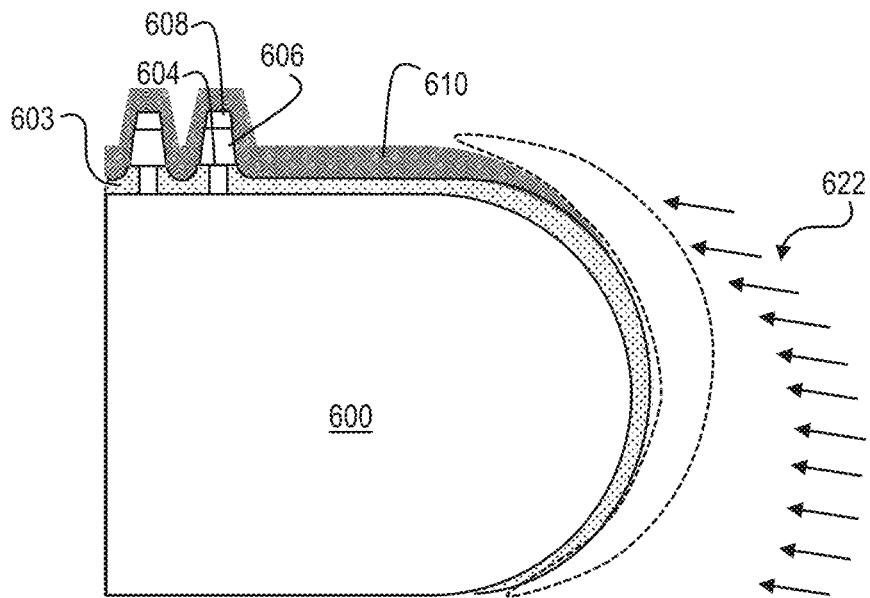

FIG. 5 depicts in a flowchart a method 500 according to an exemplary embodiment. At 502, metallize a bottom contact of a semiconductor wafer preparatory to forming a memory stack on the wafer. At 504, deposit a dielectric barrier around the bottom contact. At 506, deposit a memory stack layer (e.g., magnetic tunnel junction (MTJ) metal) on the dielectric in electrical contact with the bottom contact. At 510, deposit a metal hardmask over the memory stack layer. At 512, reactive ion etch the hardmask to form a hardmask pattern. At 514, trim the hardmask and remove the hardmask overspill from the wafer bevel using a high-angle ion beam etch. At 516, transfer the hardmask pattern to the memory stack layer using a low-to-intermediate angle ion beam etch. Here ion beam etch is used both for memory stack patterning (FIGS. 2E, 4E and 6E) and bevel material removal. Ion beam etch typically is used for MTJ stack patterning since reactive ion etch (RIE) cannot etch an MTJ stack without damaging it. Other memories (e.g. PCM, RRAM etc.) can be patterned using RIE instead of IBE in FIGS. 2E, 4E and 6E. However, the rest of the method of using high/very high angle ion beam etch for bevel material removal can still be used for other memories. At 518, cleanup with a high-angle ion beam etch. At 520, encapsulate the wafer. At 522, remove the encapsulant and the memory stack layer overspill from the wafer bevel using a very-high-angle ion beam etch. Advantageously, cleaning up the bevel of the wafer after encapsulating the memory devices results in a bevel that is free of both encapsulant and memory stack metals while also protecting the memory devices from the ion beam etch process.

FIGS. 6A-6H depict in schematics sequential conditions of a semiconductor wafer 600 at various steps during the process 500. At FIG. 6A, corresponding to the condition after step 504, the wafer 600 has a top surface 601 and has a bevel 602. On the top surface 601 there is a dielectric layer 603, which includes metallized bottom contacts 604. At FIG. 6B, corresponding to the condition after step 510, an MTJ memory stack layer 606 is deposited in electrical contact with the bottom contacts and a metal hardmask 608 is deposited onto the memory stack layer. The memory stack layer 606 has overspill 607 onto the bevel 602, and the hardmask 608 has overspill 609. At FIG. 6C, corresponding to the condition after step 512, a reactive ion etch process forms a hardmask pattern in the hardmask 608. At FIG. 6D, corresponding to step 514, a high-angle ion beam 614 trims the hardmask overspill 609 from the wafer bevel. At FIG. 6E, corresponding to step 516, the hardmask pattern is transferred to the memory stack layer 606 by a low-to-intermediate-angle ion beam 616. At FIG. 6F, corresponding to step 518, a high-angle ion beam 618 cleans up the hardmask and the memory stack layer. At FIG. 6G, corresponding to the condition after step 520, the wafer 600 is encapsulated with an encapsulant 610, which has overspill 611. At FIG. 6H, corresponding to step 522, a very-highangle ion beam 622 removes from the wafer bevel the encapsulant overspill 611 and the memory stack layer overspill 607.

Given the discussion thus far, it will be appreciated that, in general terms, an exemplary method, according to an aspect of the invention, includes forming a metallized layer at a top surface of a semiconductor wafer and depositing a memory stack layer onto the metallized layer. The metallized layer includes a bottom contact and a dielectric barrier surrounding the bottom contact. The memory stack layer forms a first overspill on a bevel of the wafer. The exemplary method further includes removing the first overspill from the bevel using a first high-angle ion beam during a cleanup etch.

In one or more embodiments, the method also includes depositing a metal hardmask onto the memory stack layer so that the hardmask forms a second overspill overlying the first overspill, forming a hardmask pattern in the hardmask by reactive ion etching of the hardmask, and removing the second overspill from the bevel using a second high-angle ion beam during trimming of the hardmask before the cleanup etch.

In one or more embodiments, the method also includes encapsulating the top surface of the semiconductor wafer after removing the first and second overspills. In one or more embodiments, the method also includes transferring the hardmask pattern to the memory stack layer by low-to-intermediate-angle ion beam etch of the memory stack layer between the hardmask trimming and the cleanup etch.

In one or more embodiments, the low-to-intermediate-angle ion beam consists essentially of ions selected from the group consisting of: Ar, Ne, Xe, and Kr. In one or more embodiments, the second high-angle ion beam consists essentially of ions selected from the group consisting of: Ar, Ne, Xe, and Kr. In one or more embodiments, the first high-angle ion beam consists essentially of ions selected from the group consisting of: Ar, Ne, Xe, and Kr.

According to another aspect, an exemplary method includes: forming a metallized layer at a top surface of a semiconductor wafer, depositing a memory stack layer onto the metallized layer, and depositing a metal hardmask onto the memory stack layer. The memory stack layer forms a first overspill on a bevel of the wafer and the hardmask forms a second overspill on the bevel. The method further includes removing the first overspill and the second overspill from the bevel using a very-high-angle ion beam during trimming of the hardmask.

In one or more embodiments, the method also includes, after trimming of the hardmask, transferring a hardmask pattern to the memory stack layer by low-to-intermediate-angle ion beam etch of the memory stack layer.

In one or more embodiments, the method also includes, after transferring the hardmask pattern, a high-angle ion beam cleanup etch. In one or more embodiments, the method also includes, after the cleanup etch, encapsulating the top surface of the wafer.

According to another aspect, an exemplary method includes forming a metallized layer at a top surface of a semiconductor wafer, depositing a memory stack layer onto the metallized layer, and depositing a metal hardmask onto the memory stack layer. The memory stack layer forms a first overspill on a bevel of the wafer and the hardmask forms a second overspill on the bevel. The method also includes removing the second overspill from the bevel using a first high-angle ion beam during trimming of the hardmask.

In one or more embodiments, the method also includes, after trimming of the hardmask, transferring a hardmask pattern to the memory stack layer by low-to-intermediate-angle ion beam etch of the memory stack layer.

In one or more embodiments, the method also includes, after transferring the hardmask pattern, using a high-angle ion beam for a cleanup etch.

In one or more embodiments, the method also includes, after the cleanup etch, encapsulating the top surface of the wafer. In one or more embodiments, the method also includes, after encapsulating the top surface of the wafer, removing the encapsulant and the first overspill from the bevel using a very-high-angle ion beam.

In one or more embodiments, the very-high-angle ion beam consists essentially of ions selected from the group consisting of: Ar, Ne, Xe, and Kr. In one or more embodiments, the high-angle ion beam consists essentially of ions selected from the group consisting of: Ar, Ne, Xe, and Kr. In one or more embodiments, the low-to-intermediate-angle ion beam consists essentially of ions selected from the group consisting of: Ar, Ne, Xe, and Kr.

In one or more embodiments, the memory stack layer comprises magnetoresistive random access memory (MRAM).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a metallized layer at a top surface of a semiconductor wafer, wherein the metallized layer comprises a bottom contact and a dielectric barrier surrounding the bottom contact;
    depositing a memory stack layer onto the metallized layer, wherein the memory stack layer forms a first overspill on a bevel of the wafer; and
    removing the first overspill from the bevel using a first high-angle ion beam during a cleanup etch.

2. The method of claim 1 further comprising:
    depositing a metal hardmask onto the memory stack layer, wherein the hardmask forms a second overspill overlying the first overspill;
    forming a hardmask pattern in the hardmask by reactive ion etching of the hardmask; and
    removing the second overspill from the bevel using a second high-angle ion beam during trimming of the hardmask before the cleanup etch.

3. The method of claim 2 further comprising encapsulating the top surface of the semiconductor wafer after removing the first and second overspills.

4. The method of claim 2 further comprising transferring the hardmask pattern to the memory stack layer by low-to-intermediate-angle ion beam etch of the memory stack layer between the hardmask trimming and the cleanup etch.

5. The method of claim 4 wherein the low-to-intermediate-angle ion beam consists essentially of ions selected from the group consisting of: Ar, Ne, Xe, and Kr.

6. The method of claim 2 wherein the second high-angle ion beam consists essentially of ions selected from the group consisting of: Ar, Ne, Xe, and Kr.

7. The method of claim 1 wherein the first high-angle ion beam consists essentially of ions selected from the group consisting of: Ar, Ne, Xe, and Kr.

8. A method comprising:
forming a metallized layer at a top surface of a semiconductor wafer;
depositing a memory stack layer onto the metallized layer, wherein the memory stack layer forms a first overspill on a bevel of the wafer;
depositing a metal hardmask onto the memory stack layer, wherein the hardmask forms a second overspill on the bevel; and
removing the first overspill and the second overspill from the bevel using a very-high-angle ion beam during trimming of the hardmask.

9. The method of claim 8 further comprising, after trimming of the hardmask, transferring a hardmask pattern to the memory stack layer by low-to-intermediate-angle ion beam etch of the memory stack layer.

10. The method of claim 9 further comprising, after transferring the hardmask pattern, performing a high-angle ion beam cleanup etch.

11. The method of claim 10 further comprising, after the cleanup etch, encapsulating the top surface of the wafer.

12. A method comprising:
forming a metallized layer at a top surface of a semiconductor wafer;
depositing a memory stack layer onto the metallized layer, wherein the memory stack layer forms a first overspill on a bevel of the wafer;
depositing a metal hardmask onto the memory stack layer, wherein the hardmask forms a second overspill on the bevel; and
removing the second overspill from the bevel using a first high-angle ion beam during trimming of the hardmask.

13. The method of claim 12 further comprising, after trimming of the hardmask, transferring a hardmask pattern to the memory stack layer by low-to-intermediate-angle ion beam etch of the memory stack layer.

14. The method of claim 13 further comprising, after transferring the hardmask pattern, using a high-angle ion beam for a cleanup etch.

15. The method of claim 14 further comprising, after the cleanup etch, encapsulating the top surface of the wafer.

16. The method of claim 15 further comprising, after encapsulating the top surface of the wafer, removing the encapsulant and the first overspill from the bevel using a very-high-angle ion beam.

17. The method of claim 16 wherein the very-high-angle ion beam consists essentially of ions selected from the group consisting of: Ar, Ne, Xe, and Kr.

18. The method of claim 14 wherein the high-angle ion beam consists essentially of ions selected from the group consisting of: Ar, Ne, Xe, and Kr.

19. The method of claim 13 wherein the low-to-intermediate-angle ion beam consists essentially of ions selected from the group consisting of: Ar, Ne, Xe, and Kr.

20. The method of claim 13 wherein the memory stack layer comprises magnetoresistive random access memory (MRAM).

* * * * *